United States Patent [19]
Gardner et al.

[11] Patent Number: 5,817,560
[45] Date of Patent: Oct. 6, 1998

[54] ULTRA SHORT TRENCH TRANSISTORS AND PROCESS FOR MAKING SAME

[75] Inventors: Mark I. Gardner, Cedar Creek; Fred N. Hause, Austin, both of Tex.

[73] Assignee: Advanced Micro Devices, Inc., Sunnyvale, Calif.

[21] Appl. No.: 713,281

[22] Filed: Sep. 12, 1996

[51] Int. Cl.$^6$ ................................................. H01L 21/336
[52] U.S. Cl. ............................................................ 438/301
[58] Field of Search .................................... 438/299, 300, 438/301, 589, 305

[56] References Cited

U.S. PATENT DOCUMENTS

| | | | |
|---|---|---|---|
| 4,324,038 | 4/1982 | Chang | 438/282 |
| 4,745,081 | 5/1988 | Beyer | 438/429 |
| 4,835,585 | 5/1989 | Panousis | 438/332 |
| 5,190,792 | 3/1993 | Blum | 427/560 |
| 5,296,410 | 3/1994 | Yang . | |
| 5,374,575 | 12/1994 | Kim | 438/291 |
| 5,472,894 | 12/1995 | Hsu et al. . | |
| 5,648,670 | 7/1997 | Blanchard | 257/329 |

FOREIGN PATENT DOCUMENTS

| | | |
|---|---|---|
| 0 491 408 A | 6/1992 | European Pat. Off. . |
| 0 655 773 A | 5/1995 | European Pat. Off. . |

OTHER PUBLICATIONS

Patent Abstracts of Japan, vol. 095, No. 007, Aug. 31, 1995, & JP 07 106560 A (Ricoh Co. Ltd.), Apr. 22, 1995.
Patent Abstracts of Japan, vol. 015, No. 165 (E–1061), Apr. 25, 1991 & JP 03 036766 A (Seiko Instr. Inc.), Feb. 18, 1991.
Patent Abstracts of Japan, vol. 010, No. 075 (E–390), Mar. 25, 1986 & JP 60 220973 A (Toshiba KK), Nov. 5, 1985.
Patent Abstracts of Japan, vol. 016, No. 108 (E–1179), Mar. 17, 1992 & JP 03 283670 A (Fuji Electric Co. Ltd.), Dec. 13, 1991.
Patent Abstracts of Japan, vol. 016, No. 297 (E–1226), Jun. 30, 1992 & JP 04 079321 A (NEC Corp.), Mar. 12, 1992.
Patent Abstracts of Japan, vol. 013, No. 525 (E–850), Nov., 22 1989 & JP 01 214057 A (Yamaha Corp.), Aug. 28, 1989.
International Search Report for PCT/US 97/16260 dated Dec. 16, 1997.

*Primary Examiner*—John Niebling
*Assistant Examiner*—Brendan Mee
*Attorney, Agent, or Firm*—Conley, Rose & Tayon; Kevin L. Daffer

[57] ABSTRACT

A field effect transistor comprising a semiconductor substrate having a transistor trench extending downward from an upper surface of the semiconductor substrate. The trench extends to a trench depth below an upper surface of the semiconductor substrate. The transistor further includes a gate dielectric layer that is formed on a floor of the transistor trench over a channel region of the semiconductor substrate. A conductive gate structure is formed above and in contact with the gate dielectric layer. A source/drain impurity distribution is formed within a source/drain region of the semiconductor substrate. The source/drain region is laterally disposed on either side of the channel region of the semiconductor substrate. In a preferred embodiment, the trench depth is between 1,000–5,000 angstroms and a thickness of the conductive gate structure is less than 5,000 angstroms such that an upper surface of the conductive gate structure is level with or below an upper surface of the semiconductor substrate. The gate dielectric layer suitably comprises a thermal oxide having a thickness of approximately 20–200 angstroms. In a lightly doped drain (LDD) embodiment, the source/drain impurity distribution includes a lightly doped region and a heavily doped region. The lightly doped region extends laterally from the channel region of the transistor to the heavily doped region. In the preferred embodiment, a lateral dimension of the channel region of the transistor is approximately 100–300 nm.

10 Claims, 3 Drawing Sheets

ULTRA SHORT TRENCH TRANSISTORS AND PROCESS FOR MAKING SAME

BACKGROUND OF THE INVENTION

1. Field of the Invention

This invention relates to the field of semiconductor processing and, more particularly, to a method of forming a field effect transistor having a channel length less than a minimum resolvable feature of the photolithography apparatus.

2. Description of the Relevant Art

The operating characteristics of a transistor fabricated with standard metal-oxide-semiconductor (MOS) integrated circuit techniques are a function of the transistor's dimensions. In particular, the transistor's source-to-drain current ($I_{ds}$) is proportional to the ratio of the transistor's width (W) to the transistor's length (L). For a given transistor width W and a given biasing condition (e.g. $V_G$=3V, $V_D$=3V, and $V_S$=0V), $I_{ds}$ is maximized by minimizing the transistor length L. Minimizing transistor channel length improves the speed of integrated circuits, which comprise a large number of individual transistors, because the larger drain current associated with a short channel length can drive the adjoining transistors into saturation more quickly. Minimizing L is, therefore, desirable from a device operation standpoint. In addition, minimizing the transistor length L is desirable from a manufacturing perspective because a smaller area of silicon is required to manufacture a transistor having a smaller length. By minimizing the area required for a given transistor, the number of transistors available for a given area of silicon increases and, with it, a corresponding increase in the circuit complexity that can be achieved on the given area of silicon.

The main limitation of minimum device size in a conventional transistor fabrication process is the resolution of the optical lithography printing system. In an optical lithography printing system, radiation is directed from an illumination source through a patterned mask and onto a photoresist layer. The patterned mask transmits the illumination source radiation onto selected areas of the photoresist layer to reproduce the mask pattern in the photoresist layer. Resolution in optical lithography systems is limited by diffraction effects, which spread radiation from the illumination source into regions of the photoresist which are not directly exposed to the illumination source. Because of diffraction effects, there is a minimum distance beyond which even a geometrically perfect lens cannot resolve two points. In other words, when two points are less than a minimum distance from each other, the two points cannot be resolved by the lithography system. The diffraction patterns associated with each point overlap each other to such an extent that the two points cannot be effectively differentiated. The resolution of a lens depends on the wavelength of the illumination source and the numerical aperture of the lens. Rayleighs criteria defines two images as being resolvable when the intensity between them drops to 80% of the image intensity. This criteria is satisfied when the $2d$=0.61 $\lambda$/NA. Where $2d$ is the separation distance of the two images, $\lambda$ is the wavelength of the energy source, and NA is the numerical aperture of the lens.

Commercially available optical photolithography machines are typically equipped with mercury vapor lamps as the illumination source. The characteristic energy spectrum of a mercury vapor lamp contains several distinct peaks in the 300 nm to 450 nm wavelength range. These peaks are commonly referred to by their industry designations.

The peak associated with a wavelength of ~436 nm is designated the "G-line," the ~405 nm peak the "H-line," and the ~370 nm peak the "I-line." Photolithography aligners are similarly designated such that it is common to speak of "G-line aligners." The minimum feature size resolvable by a G-line aligner is greater than the minimum feature size of an I-line aligner because of the longer G-line wavelength.

As process technologies approach and surpass the resolvable limits of G-line and I-line aligners, semiconductor manufacturers are typically forced to implement alternative photolithography techniques to achieve adequate resolution of the minimum features. Unfortunately, the conventional alternatives involve abandoning or substantially modifying the existing photolithography equipment at a prohibitive cost. Many wafer fabrication facilities for example, have extensive capital investment in I-line aligners. To adequately resolve features in the deep sub-micron range (i.e. <0.5 $\mu$m), it is typically necessary to upgrade these aligners or abandon the optical alignment equipment entirely and replace it with advanced lithography equipment including e-beam or x-ray lithography. The cost associated with replacing or upgrading photolithography equipment can be staggering. In addition to the capital required to purchase and install the improved equipment, there are extensive costs associated with qualifying the new equipment for production worthiness and training production and maintenance personnel in the operation and care of the new equipment.

In addition, conventional transistor fabrication processes, in which the transistor gate is formed above the semiconductor substrate, results in a non-planar surface upon which subsequent processing layers must be fabricated. The non-planar surface increases the difficulty of subsequent processing. In particular, photolithography resolution is negatively affected by variations in the thickness of the photoresist layer across non-planar regions or "steps" in the underlying substrate. Photoresist line width variations are common over steps in the underlying substrate primarily due to standing wave effects and light scattering at the steps caused by diffraction and reflection effects.

Therefore, it is highly desirable to design MOS transistor and a transistor fabrication process in which the transistor channel length is not limited by the capabilities of the photolithography equipment. It would be further desirable if such a process resulted in a substantially planar surface upon which subsequently formed structures could be more easily fabricated.

SUMMARY OF THE INVENTION

The problems identified above are in large part addressed by an ultra-short trench transistor and a method for making the same. Spacer structures are used to reduce the channel region of the semiconductor substrate to a dimension that is less than a minimum resolvable feature of a photographic aligner used to fabricate the device. In addition, the transistor gate structure is formed within a trench etched into the semiconductor substrate. The upper surface of the gate structure may be, therefore, substantially level with an upper surface of the semiconductor substrate thereby reducing the non-planarity of the surface after fabrication of the transistors.

Broadly speaking, the present invention contemplates a field effect transistor that includes a semiconductor substrate which has a transistor trench extending downward from an upper surface of the semiconductor substrate. The trench extends to a trench depth below an upper surface of the semiconductor substrate. The transistor further includes a gate dielectric layer that is formed on a floor of the transistor trench over a channel region of the semiconductor substrate. A conductive gate structure is formed above and in contact with the gate dielectric layer. A source/drain impurity distribution is formed within a source/drain region of the semiconductor substrate. The source/drain region is laterally disposed on either side of the channel region of the semiconductor substrate. In a preferred embodiment, the trench depth is between 1,000–5,000 angstroms and a thickness of the conductive gate structure is less than 5,000 angstroms such that an upper surface of the conductive gate structure is level with or below an upper surface of the semiconductor substrate.

The transistor trench preferably includes first and second trench sidewalls that extend downward from the upper surface of the semiconductor substrate to a transistor trench floor. The first and second trench sidewalls, in a preferred embodiment, are substantially perpendicular to an upper surface of the semiconductor substrate. The gate dielectric layer suitably comprises a thermal oxide having a thickness of approximately 20–200 angstroms. In a lightly doped drain (LDD) embodiment, the source/drain impurity distribution includes a lightly doped region and a heavily doped region. The lightly doped region extends laterally from the channel region of the transistor to the heavily doped region. In this embodiment, a peak concentration of the heavily doped region typically exceeds a peak concentration of the lightly doped region. The source/drain impurity distribution includes ions of the elements typically used to dope conductive regions of a semiconductor transistor, namely: Boron, phosphorus, and arsenic. In the preferred embodiment, a lateral dimension of the channel region of the transistor is approximately 100–300 nm.

The present invention further contemplates a method of forming a field effect transistor comprising a first step of providing a semiconductor substrate. The semiconductor substrate typically includes an active region laterally displaced between a pair of isolation regions. A transistor trench is formed in the semiconductor substrate. The trench includes first and second trench sidewalls extending downward a trench depth from an upper surface of the semiconductor substrate to a trench floor. First and second channel spacer structures are then formed on the first and second trench sidewalls, respectively. The first and second channel spacer structures are formed such that the structures extend away from the first and second trench sidewalls to first and second boundaries of the channel region of the semiconductor substrate, respectively. Subsequent to the formation of the first and second spacer trench structures, a gate dielectric layer is formed on the trench floor. The trench floor is laterally displaced between the first and second channel spacer structures. A conductive gate structure is then formed on the gate dielectric layer. Thereafter, impurity distributions are introduced into source/drain regions of the semiconductor substrate and simultaneously introduced into the conductive gate structure. The source/drain regions are preferably disposed laterally on either side of the channel region.

In one embodiment of the present invention, the process of forming the transistor trench comprises forming a patterned masking layer on an upper surface of the semiconductor substrate. The patterned masking layer is formed such that it exposes an upper surface of a first region of the semiconductor substrate. Thereafter, the first region of the semiconductor substrate is etched with a chlorinated plasma such that a transistor trench is formed in the semiconductor substrate. The patterned masking layer is preferably formed by a process sequence in which an oxide layer is deposited on an upper surface of the semiconductor substrate. Thereafter, a silicon nitride layer is deposited on the oxide layer. A patterned photoresist layer is formed on the silicon nitride layer with a photolithography apparatus such that the patterned photoresist layer exposes a first region of the silicon nitride layer. The first region of the silicon nitride layer and a first region of the oxide layer are then etched such that an upper surface of the first region of the semiconductor substrate is exposed. In the preferred embodiment, a lateral dimension of the first region of the semiconductor substrate is approximately equal to a minimum resolvable feature of the photolithography apparatus. Prior to the etching of the first region of the semiconductor substrate, one embodiment of the process includes the steps of depositing a first spacer layer on a topography cooperatively defined by the patterned masking layer and the semiconductor substrate. Preferably, a conformality of the first spacer layer exceeds approximately 80%. The first spacer layer is then anisotropically etched such that a pair of first spacer structures are formed on sidewalls of the patterned masking layer. The first spacer structures extend outward from respective sidewalls of the patterned masking layer to respective boundaries of a trench region of the semiconductor substrate. In an embodiment in which a lateral dimension of the first region is approximately equal to a minimum resolvable feature of the photolithography apparatus, the incorporation of the first spacer layer and the first spacer structures results in a trench region having a lateral dimension that is less than the minimum resolvable feature of the photolithography apparatus.

Preferably, the steps of forming the channel spacer structures includes depositing a channel spacer layer on a topography cooperatively defined by the transistor trench and the semiconductor substrate. The channel spacer layer is then anisotropically etched to produce first and second channel spacer structures extending outward from respective sidewalls of the transistor trench to respective boundaries of a channel region of the semiconductor substrate.

Preferably, the gate dielectric layer is formed by growing a thermal oxide layer having a thickness of approximately 20–200 angstroms on the trench floor. The conductive gate structure is preferably formed by depositing a polysilicon layer to fill the transistor trench and removing portions of the polysilicon layer exterior to the transistor trench preferably through the use of a planarization step such as a chemical-mechanical polish. The impurity distributions are introduced into the semiconductor substrate preferably by forming an implant dielectric layer over the first and second source/drain regions of the semiconductor substrate and implanting ions of boron, phosphorus, or arsenic into the heavily doped regions of the first and second source/drain regions of the substrate. In a lightly doped drain embodiment of the present invention, the method further includes the steps of removing an upper portion of the first and second channel spacer structures suitably accomplished with a wet or dry etch process, and introducing a second impurity distribution into first and second lightly doped regions of the semiconductor substrate. The lightly doped regions extend between the channel region and first and the heavily doped regions of the semiconductor substrate.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE INVENTION

Figure 1:
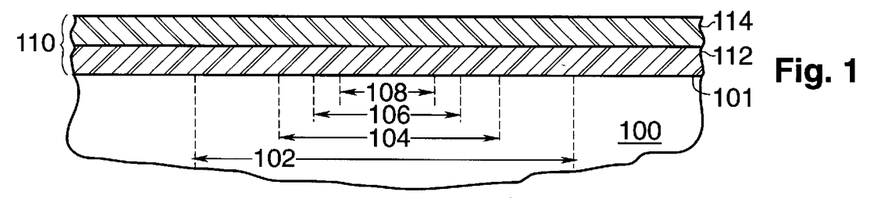
FIG. 1 is a partial cross-sectional view of a semiconductor substrate upon which a masking layer has been formed.

Turning now to the drawings, FIG. 1 shows a partial cross-sectional view of semiconductor substrate 100. Typically, semiconductor substrate 100 comprises single crystal silicon preferably with a resistivity of approximately 10–15 Ω-cm. Semiconductor substrate 100 includes active region 102 into which a transistor could be formed, a first region 104, a trench region 106, and a channel region 108, all of which will be described in greater detail below. Masking layer 110, in the embodiment shown in FIG. 1, includes a first dielectric layer 112 formed on an upper surface 101 of semiconductor substrate 100. First dielectric 112 preferably comprises a chemically vapor deposited (CVD) oxide formed from a TEOS or silane source. A second dielectric layer 114 suitably comprised of CVD silicon nitride is formed on an upper surface of first dielectric 110.

Figure 2:
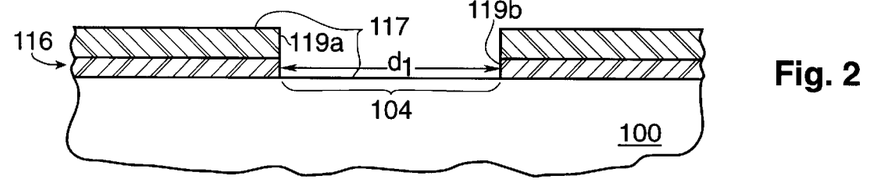
FIG. 2 is a processing step subsequent to FIG. 1, in which the masking layer has been patterned to expose a first region of the semiconductor substrate.

FIG. 2 shows a subsequent processing step in which masking layer 110 has been selectively etched to form patterned masking layer 116. The patterning of masking layer 110 is accomplished with techniques well known in the field of semiconductor processing. A photoresist layer (not shown) is deposited upon an upper surface of masking layer 110 and selectively exposed to an optical energy source, such as a mercury vapor lamp, such that the portions of masking layer 110 exposed to the energy source become highly soluble in aqueous developer solutions. The selective exposure of the photoresist layer is accomplished with a photolithography aligner and a patterned photomask according to well known photolithography processes. After the selective exposure of the photoresist layer, the photoresist layer is immersed in an aqueous solution that dissolves the exposed regions of the photoresist layer. Thereafter, masking layer 110 is patterned through wet or dry etch processes. In the preferred embodiment shown in FIG. 2, patterned masking layer 116 includes substantially vertical sidewalls 119a and 119b, typically associated with an anisotropic dry etch process. Patterned masking layer 116 and upper surface 101 of semiconductor substrate 100 cooperatively define topography 117.

As discussed previously, photolithography equipment such as the photolithographic aligner used to pattern the photoresist layer can not resolve geometries smaller than a minimum feature size characteristic of the aligner. In a presently preferred embodiment, masking layer 110 is patterned such that patterned masking layer 116 exposes first region 104 of semiconductor substrate 100. In a presently preferred embodiment designed to fabricate a transistor having the shortest possible channel length, a lateral dimension $d_1$ of first switch region 104 is approximately equal to the minimum feature size of the photolithography aligner. Regardless of the photolithography aligner used, the present invention contemplates a transistor and a method for forming such a transistor in which the channel length of the transistor is less than the minimum feature resolvable by the photolithography equipment. Through the subsequent use of one or more pairs of spacer structures as described below, the present invention is capable of reproducibly manufacturing sub-minimal transistors (i.e., transistors having a channel length that is less than the minimum resolvable feature of the photolithography apparatus used during the fabrication of the transistor).

Figure 3:
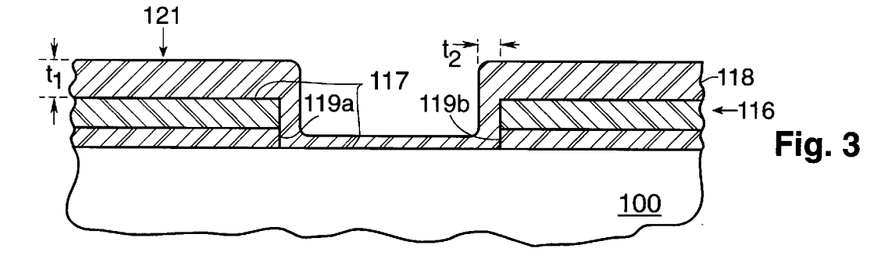
FIG. 3 is a optional processing step subsequent to FIG. 2, in which a spacer material has been deposited on the topography defined by the patterned masking layer and the semiconductor substrate.
Figure 4:
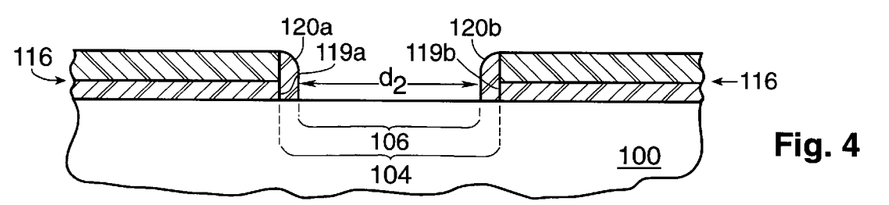
FIG. 4 is a processing step subsequent to FIG. 3, in which the spacer material has been anisotropically etched to form spacer structures on the sidewalls of the patterned masking layer.

FIGS. 3 and 4 show the optional formation of a pair of first spacer structures 120a and 120b. In FIG. 3, a first spacer layer 118 is deposited upon topography 117. First spacer layer 118, preferably comprised of a CVD oxide, is ideally deposited under conditions conducive to the formation of a conformal film. More specifically, first spacer layer 118 is preferably deposited under low pressure (i.e., less than approximately 2 torrs) conditions. Ideally, the conformality of first spacer layer 118 is greater than approximately 80%. For purposes of this disclosure, conformality refers to the ratio of the thickness of the deposited layer on the sidewalls on an underlying structure to the thickness of the deposited layer over planar regions of the underlying structure. More precisely, the conformality of first spacer layer 118 is equal to the ratio of a first thickness $t_1$ to a second thickness $t_2$, where first thickness $t_1$ is the thickness of first spacer layer 118 over planar regions 121 of topography 117 and second thickness $t_2$ is the thickness of first spacer layer 118 formed on sidewalls 119 of topography 117.

In FIG. 4, formation of first spacer structures 120a and 120b is completed by anisotropically etching first spacer layer 118. As is well known, an anisotropic etch of a conformal layer such as first spacer layer 118 results in the formation of spacer structures such as spacer structures 120a and 120b if the etch is performed with a minimum overetch. In other words, the etch of first spacer layer 118 is performed until first spacer layer 118 is just removed from planar regions 121 of topography 117 plus a minimal overetch (i.e., the duration of the overetch process is less than approximately 10% of the main etch cycle). First spacer structures 120a and 120b extend away from sidewalls 119a and 119b of patterned masking layer 116 to respective boundaries of trench region 106 of semiconductor substrate 100. In this manner, first spacer structures 120a and 120b are used to define the boundaries of a subsequently formed trench. In an embodiment in which lateral dimension $d_1$ of first region 104 of semiconductor substrate 100 is approximately equal to a minimum resolvable feature of the photolithography apparatus, a lateral dimension $d_2$ of trench region 106 is sub-minimal or less than the minimum resolvable feature of the photolithography apparatus.

Figure 5:
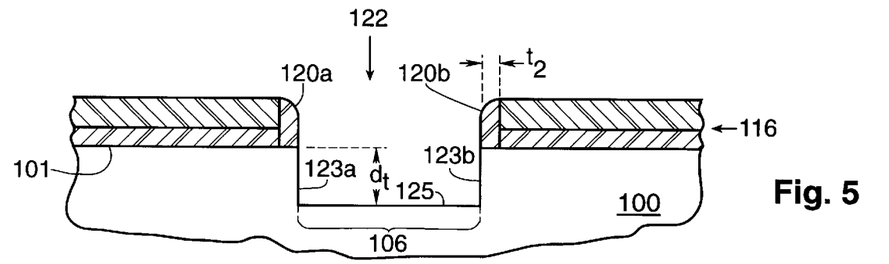
FIG. 5 is a processing step subsequent to FIG. 4, in which a transistor trench has been etched into the semiconductor substrate.

In FIG. 5, transistor trench 122 is etched into trench region 106 of semiconductor substrate 100. In a preferred embodiment in which semiconductor substrate 100 comprises single crystal silicon, transistor trench 122 is suitably formed with use of a chlorinated plasma etch process. Transistor trench 122 includes a pair of sidewalls 123a and 123b and a trench floor 125. In the embodiment in which transistor trench 122 is formed with a dry anisotropic etch process, trench sidewalls 123a and 123b are substantially perpendicular to upper surface 101 of semiconductor substrate 100. Trench floor 125 is located a trench depth $d_t$ below upper surface 101 of semiconductor substrate 100. Preferably, trench depth $d_t$ is approximately 1,000–5,000 angstroms. Transistor trench 122 is formed within trench region 106 of semiconductor substrate 100 such that the lateral dimension of transistor trench 122 and the lateral dimension $d_2$ of trench region 106 are approximately equivalent. Accordingly, in an embodiment in which lateral dimension $d_1$ of first region 104 of transistor 100 is approximately equal to the minimum resolvable feature of the photolithography equipment, lateral dimension $d_2$ of transistor trench 122 is sub-minimal or less than the minimal resolvable feature by twice the thickness $t_2$ of spacer structures 120a and 120b. The thickness $t_2$ of spacer structures 120a and 120b can be accurately controlled through the manipulation of the pressure at which first spacer layer 118 (shown in FIG. 3) is deposited and, to a lesser extent, through the manipulation of the spacer etch process parameters. In a presently preferred embodiment, a desirable thickness $t_2$ of spacer structures 120a and 120b is approximately 100–200 nm.

Figure 6:
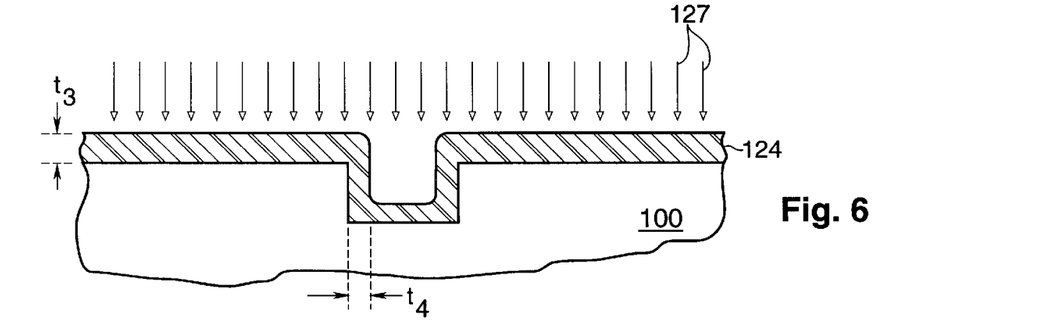
FIG. 6 is a processing step subsequent to FIG. 5, in which a channel spacer material has been deposited on the topography cooperatively defined by the semiconductor substrate and the transistor trench and ion implantations have been performed to dope the semiconductor substrate.

FIG. 6 shows the deposition of a channel spacer layer 124 on the topography defined by semiconductor substrate 100 and transistor trench 122. Similar to first spacer layer 118 (shown and described with respect to FIG. 3), the deposition of channel spacer layer 124 is preferably accomplished in a low pressure chemical vapor deposition process such that the conformality of channel spacer layer 124 is greater than approximately 80%. Preferably, channel spacer layer 124 is a TEOS or silane based oxide. FIG. 6 also shows ion implantation 127, which represents one or more implant steps performed prior to the formation of individual transistors. For example, ion implantation 127 may include the well implants of a CMOS process, threshold adjust implants, channel stop implants, or any combination thereof. Ion implants 127 may be performed either before or after deposition of channel spacer layer 124. In an embodiment in which ion implants 127 are performed prior to the deposition of channel spacer layer 124, a sacrificial dielectric layer (not shown in the drawing) may be deposited prior to the implantation to minimize lattice damage to silicon substrate 100 from the high energy ions. It will be understood by those skilled in the art of semiconductor processing that, if the present invention is incorporated into a CMOS process, ion implants 127 may be performed in conjunction with masking steps designed to selectively introduce impurities into n-channel regions or p-channel regions.

Figure 7:
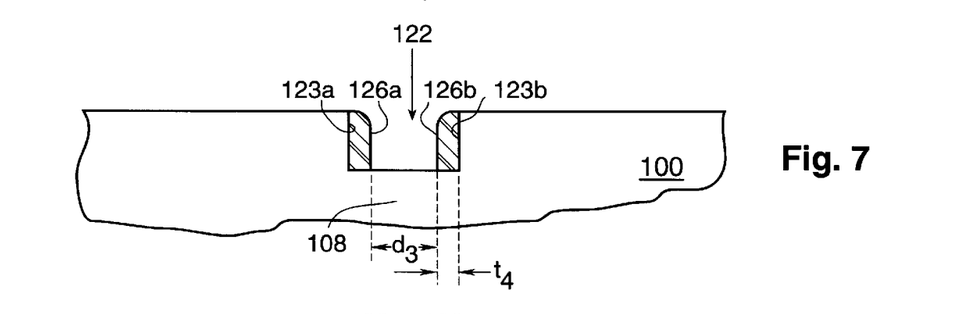
FIG. 7 is a processing step subsequent to FIG. 6, in which the channel spacer material has been anisotropically etched to form channel spacer structures on respective sidewalls of the transistor trench.

In FIG. 7, patterned masking layer 116 and first spacer structures 120a and 120b have been removed. In an embodiment in which patterned masking layer 116 includes a silicon nitride layer, the removal of patterned masking layer includes the step of removing the silicon nitride layer, preferably with a wet 85% phosphoric acid solution heated to approximately 120° C. The removal of any remaining oxide upon silicon substrate 100 is accomplished with a wet etch process using an HF solution. Thereafter, channel spacer layer 124 is anisotropically etched to form first and second channel spacer structures 126a and 126b, respectively. Channel spacer structures 126, similar to first spacer structures 120 (shown in FIG. 4) are formed by anisotropically etching channel spacer layer 124 with a minimum (i.e., less than 10%) overetch. First and second channel spacer structures 126a and 126b extend from first and second sidewalls 123a and 123b, respectively, of transistor trench 122 to respective boundaries of channel region 108. In a presently preferred embodiment, a thickness $t_4$ of first and second channel spacer structures is approximately equal to 100–200 nm such that a lateral dimension $d_3$ of channel region 108 is approximately 200–400 nm less than lateral dimension $d_2$ of transistor trench 122.

Figure 8:
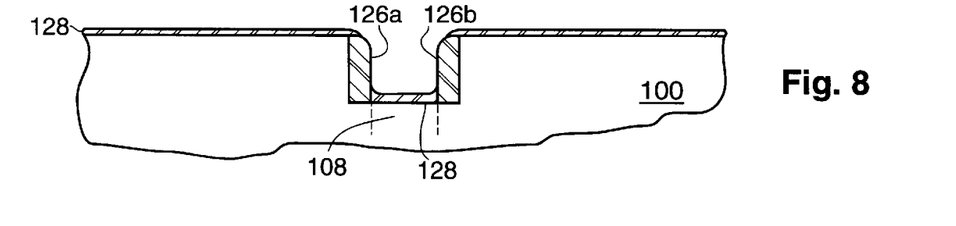
FIG. 8 is a processing step subsequent to FIG. 7, in which a gate dielectric layer has been formed on the trench floor laterally disposed between the channel spacer structures.

FIG. 8 is a processing step subsequent to FIG. 7, in which gate dielectric layer 128 is formed over channel region 108 laterally disposed between first and second channel spacer structures 126a and 126b. Ideally, the formation of gate dielectric layer 128 is accomplished with a thermal oxidation process, either through the use of a batch process, thermal oxidation furnace at a temperature of approximately 700°–900° C. or through the use of a rapid thermal anneal process, preferably performed at a temperature of approximately 700°–1000° C. In a presently preferred embodiment, a thickness of gate dielectric layer 128 is preferably between approximately 20–200 angstroms.

Figure 9:
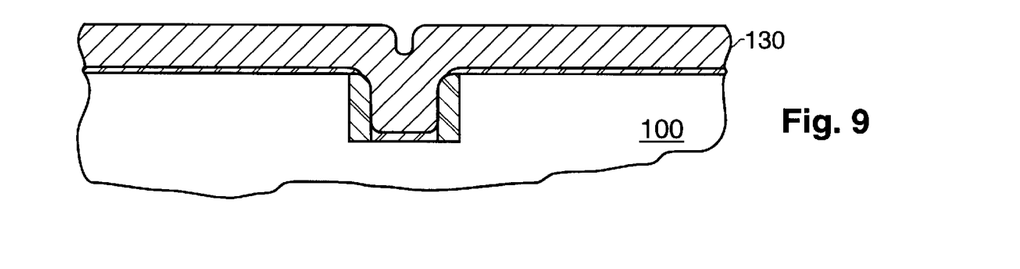
FIG. 9 is a processing step subsequent to FIG. 8, in which a conductive gate material has been deposited on the semiconductor substrate to fill the transistor trench.
Figure 10:
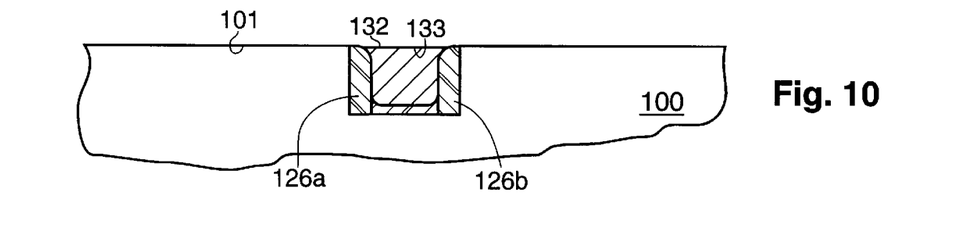
FIG. 10 is a processing step subsequent to FIG. 9, in which the conductive gate material exterior to the transistor trench has been removed.

FIGS. 9 and 10 reveal preferred processing steps for forming the conductive gate structure of the transistor of the present invention. In FIG. 9, a conductive gate layer 130 is deposited upon a topography defined by semiconductor substrate 100, channel spacer structures 126, and transistor trench 122 to fill transistor trench 122 with conductive material. In a presently preferred embodiment, conductive gate layer 130 comprises CVD polysilicon. In FIG. 10, portions of conductive gate layer 130 exterior to transistor trench 130 are removed to form conductive gate structure 130. Removal of conductive gate layer 130 exterior to transistor trench 122 is preferably accomplished with a chemical mechanical polish or other planarization process. The planarization process is performed until an upper surface 133 of conductive gate structure 132 is approximately level with upper surface 101 of semiconductor substrate 100.

Figure 11:
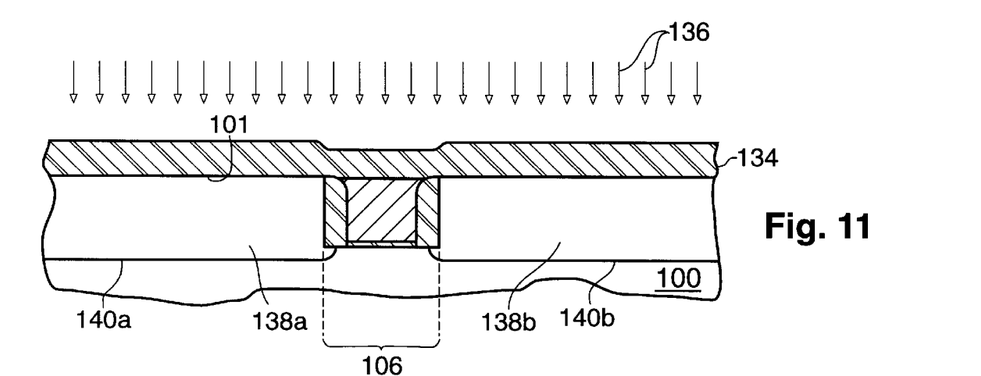
FIG. 11 is a processing step subsequent to FIG. 10, in which a first impurity distribution is introduced into the semiconductor substrate and the conductive gate structure through an implant dielectric formed on upper surface of the semiconductor substrate.

FIG. 11 reveals a processing step subsequent to FIG. 10 in which the source/drain regions of the transistor are formed. In a preferred embodiment, a sacrificial implant dielectric layer 134 is formed on upper surface 101 of semiconductor substrate 100. Thereafter, a first source/drain implant 136 is performed to introduce a first impurity distribution 138a and 138b into first source/drain regions 140a and 140b, respectively. First source/drain regions 140a and 140b are laterally disposed on either side of channel region 108. Subsequent to first implant 136, semiconductor substrate is suitably subjected to a high temperature step to drive first impurity distribution 138a and 138b. This drive-in step ideally distributes first impurity distribution 138a and 138b such that they extend from upper surface 101 to a boundary of first source/drain region 140 located at a depth approximately equal to or below trench floor 125. First impurity distribution 138a and 138b preferably extend to upper surface 101 to reduce the resistivity of a subsequent contact to first source/drain regions 140a and 140b. The drive-in step is preferably maintained until first impurity distribution 130a extends below trench floor 125 and laterally encroaches upon trench region 106 to minimize the capacitive coupling when a threshold voltage is subsequently applied to conductive gate structure 132. First implant 136 also introduces impurities into conductive gate structure 132. Ideally, first implant 136 is sufficient to reduce the sheet resistivity of gate structure 132 to less than approximately 500 $\Omega$/sq.

Figure 12:
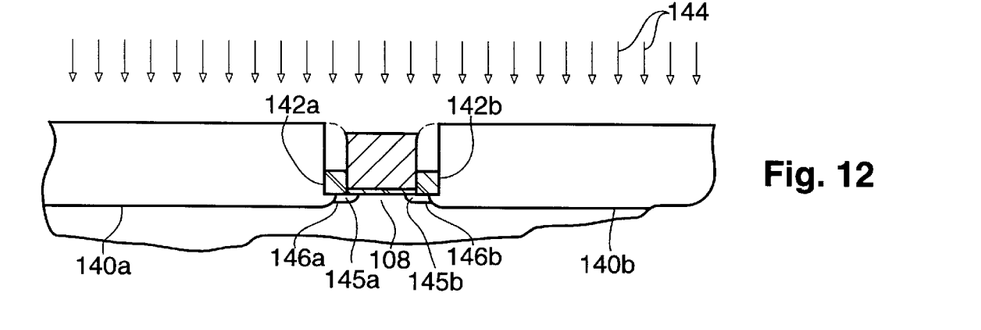
FIG. 12 is an optional processing step subsequent to FIG. 11, in which a second impurity distribution is introduced into lightly doped regions of the semiconductor substrate.

FIG. 12 shows an optional processing step, used in a lightly doped drain (LDD) embodiment of the present invention. Upper portions of channel spacer structures 126a and 126b are removed, preferably with a wet etch process, such that lower portions 142a and 142b of channel spacer structures 126a and 126b remain. Thereafter, a second source/drain implant 144 is performed to introduce a second impurity distribution 145a and 145b into lightly doped source/drain regions 146a and 146b, respectively. Lightly doped source/drain regions 146a and 146b extend laterally between the boundaries of heavily doped regions 140a and 140b and channel regions 108. Lightly doped drain regions 145a and 145b reduce the maximum electric field encountered in semiconductor substrate 100, and thereby reduce the occurrence of hot electrons being injected into channel region 108. Accordingly, a peak concentration of second impurity distribution 145a and 145b is preferably less than a peak concentration of first impurity distribution 138a and 138b. First implant 136 (shown in FIG. 11) and second source/drain implant 144 both preferably introduce ions of phosphorus, arsenic, or boron into semiconductor substrate 100. In an n-channel embodiment of the present invention, first source/drain implant 136 and second source/drain implant 144 use phosphorus or arsenic ions while, in a p-channel embodiment, boron ions are used. Subsequent to second source/drain implant 144, the void left behind when upper portions of channel spacer structures 126a and 126b were removed (shown in phantom in FIG. 12) are refilled preferably through the chemical vapor deposition of an oxide material and a subsequent planarization to remove oxide material from regions above upper surface 101 of semiconductor substrate 100.

FIG. 12 shows a transistor 151 according to the present invention. Transistor 151 includes a semiconductor substrate 100 into which a trench transistor 122 is formed. Trench 122 extends downward a trench depth $d_t$ below upper surface 101 of semiconductor substrate 100. Transistor 151 further includes a gate dielectric layer 128 formed on a floor 125 of trench transistor 122. Gate dielectric 128 is formed over a channel region 108 of semiconductors substrate 100 laterally displaced between lower portions of a first channel spacer structure 142a second channel spacer structure 142b. The lower portions 142a and 142b of the channel spacer structures extend outward from sidewalls 123a and 123b. Transistor 151 further includes a conductive gate structure 132 that is above and in contact with gate dielectric layer 128. Preferably, conductive gate structure comprises heavily doped polysilicon (i.e., a sheet resistivity of the polysilicon is less than approximately 500 $\Omega$/sq.). In the presently preferred embodiment, upper surface 133 of conductive gate structure 132 is level with or below upper surface 101 of semiconductor substrate 100. First impurity distributions 138a and 138b are formed within first source/drain impurity regions 140a and 140b, respectively. First source/drain regions 140a and 140b are laterally disposed on either side of channel region 108 of semiconductor substrate 100. In a presently preferred embodiment, first source/drain impurity distributions 138a and 138b extends from upper surface 101 of semiconductor substrate 100 to a depth below trench floor 125 of transistor trench 122 and extend laterally beyond the boundaries of transistor trench region 106. In a lightly doped drain embodiment of the transistor 151, second or lightly doped source/drain impurity distribution 145a and 145b are introduced into a second or lightly doped source/drain regions 146a and 146b of semiconductor substrate 100. Second source/drain regions 146a and 146b extend laterally from first source/drain regions 140a and 140b to respective boundaries of channel region 108. Preferably, a peak concentration of the first impurity distributions 138a and 138b is greater than a peak concentration of the second impurity distributions 145a and 145b. First and second source/drain impurity distributions 138 and 140 are suitably comprised of ions of phosphorus, boron or arsenic. Channel region 108 of transistor 151 in a presently preferred embodiment has a lateral dimension $d_3$ that is approximately 100–300 nm.

Figure 13:
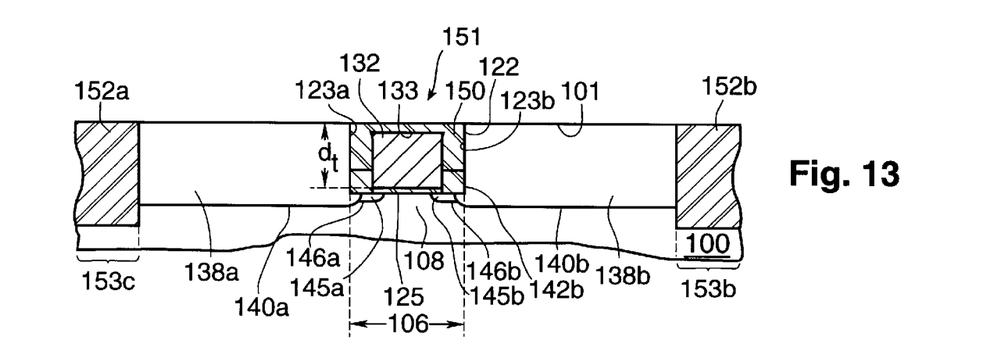
FIG. 13 is a processing step subsequent to FIG. 12, in which isolation structures have been formed in isolation regions of the semiconductor substrate.

FIG. 13 also shows first and second isolation structures 152a and 152b formed in isolation regions 153a and 153b of semiconductor substrate 100. The isolation structures 152 shown in the figure comprise shallow trench isolation structures. Formation of shallow trench structures is accomplished by etching an isolation trench into a semiconductor substrate 100 and filling the trench with a CVD dielectric such as CVD TEOS or silane oxide and thereafter planarizing a structure with a chemical mechanical polish or other planarization process such that the isolation structure is substantially embedded within semiconductor substrate and such that an upper surface of the isolation structure 152 is substantially planar with upper surface 101 of semiconductor substrate 100. Although, the preferred embodiment shown in FIGS. 1–13 discloses the formation of isolation structures 152 after the formation of transistor 151, it is to be understood that in an alternative embodiment, isolation structures 152 could be formed within isolation regions 153 prior to the formation of transistor 151. More specifically, isolation structures 152a and 152b could be formed in isolation regions 153a and 153b, respectively, of semiconductor substrate 100 prior to the formation of masking layer 110 on upper surface 101 of semiconductor substrate as shown in FIG. 1. It is also to be understood that alternative isolation structures such as the well known LOCOS isolation structure can be substituted for shallow trench isolation structures shown in FIG. 13. As is well known, LOCOS structures are formed by selectively oxidizing isolation regions of semiconductor substrate 100. The selective oxidation of a silicon substrate is accomplished preferably through the use of a patterned silicon nitride layer, typically formed on a sacrificial oxide layer.

It will be appreciated to those skilled in the art having the benefit of this disclosure that this invention is capable of forming a transistor having an effective channel length that is shorter than the minimum feature size resolvable by a photolithography exposure device and resulting in a substantially planar upper surface. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A method of forming a field effect transistor, comprising:

providing a semiconductor substrate, wherein said semiconductor substrate comprises an active region laterally displaced between a pair of isolation regions;

forming a transistor trench in said semiconductor substrate, wherein said transistor trench comprises first and second trench sidewalls extending downward a trench depth from an upper surface of said semiconductor substrate to a trench floor;

depositing a channel spacer layer on a topography cooperatively defined by said transistor trench and said semiconductor substrate;

anisotropically etching an entirety of said channel spacer layer to produce first and second channel spacer structures which extend away from said first and second trench sidewalls to first and second boundaries of a channel region of said semiconductor substrate;

forming a gate dielectric layer on said trench floor laterally disposed between said first and second channel spacer structures;

forming a conductive gate structure on said gate dielectric layer; and introducing a first impurity distribution into a first source/drain region of said semiconductor substrate and into said conductive gate structure, wherein said first source/drain regions are laterally disposed on either side of said channel region.

2. The process of claim 1 wherein the step of forming said transistor trench comprises:

forming a patterned masking layer on said upper surface of said semiconductor substrate such that said patterned masking layer exposes an upper surface of a first region of said semiconductor substrate; and etching said first region of said semiconductor substrate with a chlorinated plasma whereby said transistor trench is formed in said semiconductor substrate.

3. The process of claim 2, further comprising, prior to the etching of said first region of said semiconductor substrate, the steps of:

depositing a first spacer layer on a topography cooperatively defined by said patterned masking layer and said semiconductor substrate such that a conformality of said first spacer layetexceeds approximately 80%; and anisotropically etching said first spacer layer such that a pair of first spacer structures are formed on sidewalls of said patterned masking layer, wherein said first spacer structures extend outward from respective sidewalls of said patterned masking layer to respective boundaries of a trench region of said semiconductor substrate.

4. The process of claim 2 wherein the step of forming said patterned masking layer comprises:

depositing an oxide layer on said upper surface of said semiconductor substrate;

depositing a silicon nitride layer on said oxide layer;

forming a patterned photoresist layer on said silicon nitride layer with a photolithography apparatus such that said patterned photoresist layer exposes a first region of said silicon nitride layer;

etching said first region of said silicon nitride layer and a first region of said oxide layer such that an upper surface of a first region of said semiconductor substrate is exposed; and removing said patterned photoresist layer.

5. The method of claim 4 wherein a lateral dimension of said first region of said semiconductor substrate is approximately equal to a minimum resolvable feature of said photolithography apparatus.

6. The method of claim 1 wherein the step of forming said gate dielectric layer comprises growing a thermal oxide layer, wherein a thickness of said thermal oxide layer is approximately 20 to 200 angstroms.

7. The method of claim 1 wherein the step of forming said conductive gate structures comprises:

depositing a polysilicon layer to fill said transistor trench; and removing portions of said polysilicon layer exterior to said transistor trench.

8. The method of claim 7 wherein the step of removing portions of said polysilicon layer comprises chemical mechanical polishing said polysilicon layer.

9. The method of claim 1 wherein the step of introducing said impurity distributions comprises:

forming an implant dielectric layer over said first and second source/drain regions of said semiconductor substrate; and implanting ions selected from the group consisting of boron, phosphorous, and arsenic into heavily doped regions of said first and second source/drain regions of said semiconductor substrate.

10. The method of claim 9 further comprising:

removing an upper portion of said first and second channel spacer structures;

introducing a second impurity distribution into second source/drain regions of said semiconductor substrate, wherein said second source/drain regions extend between said channel region and said first source/drain regions of said semiconductor substrate respectively, and further wherein a peak concentration of said first impurity distribution is greater than a peak concentration of said second impurity distribution.

* * * * *

UNITED STATES PATENT AND TRADEMARK OFFICE
CERTIFICATE OF CORRECTION

PATENT NO. : 5,817,560
DATED : October 6, 1998
INVENTOR(S) : Mark I. Gardner and Fred N. Hause It is certified that error appears in the above-identified patent and that said Letters Patent is hereby corrected as shown below:

Claim 3, col. 11, line 62, please delete the phrase "layetexceeds" and substitute therefor --layer exceeds--.

Signed and Sealed this

Sixteenth Day of February, 1999

Attest:

*Acting Commissioner of Patents and Trademarks*

*Attesting Officer*